(12) United States Patent
Igarashi et al.

(10) Patent No.: US 6,695,985 B2
(45) Date of Patent: Feb. 24, 2004

(54) ELECTROMAGNETIC WAVE SUPPRESSOR SHEET

(75) Inventors: Kazumasa Igarashi, Ibaraki (JP); Junichi Toyoda, Tokyo (JP); Katsumi Okayama, Kanagawa (JP)

(73) Assignees: Nitto Denko Corporation, Osaka (JP); Sony Corporation, Tokyo (JP)

( * ) Notice: Subject to any disclaimer, the term of this patent is extended or adjusted under 35 U.S.C. 154(b) by 0 days.

(21) Appl. No.: 10/166,024

(22) Filed: Jun. 11, 2002

(65) Prior Publication Data

US 2002/0198286 A1 Dec. 26, 2002

(30) Foreign Application Priority Data

Jun. 12, 2001 (JP) .................................. P2001-177510

(51) Int. Cl.[7] ............................. H01F 1/44; H05K 9/00; B32B 5/16
(52) U.S. Cl. ................ 252/518.1; 252/511; 252/513; 252/62.51; 252/62.55; 252/62.56; 423/231; 423/632; 420/8; 420/103; 420/117; 501/120; 428/692; 174/35 MS
(58) Field of Search ............... 252/62.51, 62.55, 252/62.56, 62–59, 62.63, 511, 518.1, 513; 423/231, 632, 633, 635, 323, 692; 420/8, 103, 117; 501/120; 174/35 MS

(56) References Cited

U.S. PATENT DOCUMENTS

| 6,448,491 B1 | * | 9/2002 | Sato et al. ............. 174/35 MS |
| 2002/0039667 A1 | * | 4/2002 | Takaya et al. ............. 428/692 |
| 2003/0024723 A1 | * | 2/2003 | Igarashi et al. ............. 174/52.1 |

FOREIGN PATENT DOCUMENTS

| EP | 785557 | * | 7/1997 | ............. H01F/1/37 |
| JP | 09-035927 | * | 2/1997 | ............. H01F/1/44 |
| JP | 11-087972 | * | 3/1999 | ............. H05K/9/00 |
| JP | 2000-228598 | * | 8/2000 | ............. H05K/09/00 |

* cited by examiner

Primary Examiner—Yogendra N. Gupta
Assistant Examiner—Kallambella Vijayakumar
(74) Attorney, Agent, or Firm—Sughrue Mion, PLLC

(57) ABSTRACT

An electromagnetic wave suppressor sheet formed into a sheet-like shape out of a material made of synthetic resin in which powder of conjugated magnetic particles surface-treated with an insulating inorganic material has been dispersed.

28 Claims, 1 Drawing Sheet

ELECTROMAGNETIC WAVE SUPPRESSOR SHEET

The present application is based on Japanese Patent Application No. 2001-177510, which is incorporated herein by reference.

BACKGROUND OF THE INVENTION

1. Field of the Invention

The present invention relates to an electromagnetic wave suppressor sheet having adequate electric insulation properties and an electromagnetic wave suppressing function.

2. Description of the Related Art

Generally, the problem of EMC (Electro-Magnetic Compatibility) has been manifest in electric equipment. Measures against the problem have been taken from the two points of view of emission of unnecessary electromagnetic waves and durability. In recent years, with the advance of miniaturization and higher functions of information communication equipment, semiconductor devices have a tendency to further increase their operating frequencies in order to have higher performance. Particularly with digital signals processed at a higher rate, amplitude values of the signals become lower in order to reduce power consumption. Thus, there is increasing a risk that even weak radio-frequency noise causes a malfunction.

For such a reason, covering a semiconductor package with a metal cap or mounting a filter on a printed wiring circuit board has been heretofore carried out as one measure against this risk. However, since an extra mounting space is required, the mounting density of electronic parts cannot increase satisfactorily. Accordingly, other solutions have been investigated. Nowadays, from such a background, an electromagnetic wave shielding technique suitable for high-density mounting is demanded. For example, as proposed in Unexamined Japanese Patent Publication No. Hei. 9-35927 (hereinafter referred to as "related art"), a method in which an electromagnetic wave suppressor sheet is installed near the place where unnecessary electromagnetic waves are generated in electronic equipment has been known as one of methods for absorbing unnecessary electromagnetic waves of the electronic equipment and shielding the electronic equipment. The electromagnetic wave suppressor sheet is obtained as follows. That is, soft magnetic material particles which have a large imaginary part $\mu''$ of complex permeability (hereinafter referred to as "imaginary part permeability") are mixed and dispersed into synthetic resin, and formed into the electromagnetic wave suppressor sheet.

Some of magnetic particles heretofore used to be mixed and dispersed in electromagnetic wave suppressor sheets have a low insulation resistance value. However, an electromagnetic wave suppressor sheet manufactured with the use of a material in which such magnetic particles having a low insulation resistance value have been mixed and dispersed as filler at a high ratio may be placed directly on lead pins of a semiconductor package or placed on conductors of a printed wiring circuit board. In such a case, there has been a risk of short-circuit. If there does not occur short-circuit, the electric insulation resistance value of the electromagnetic wave suppressor sheet becomes so small that there has been a risk of so-called signal crosstalk in which an electric signal in one signal line leaks into another signal line.

For such a reason, in order to secure the electric insulation properties, the related art discloses a technique in which an oxidation process such as a vapor-phase slow oxidation process or a liquid-phase slow oxidation process is applied to soft magnetic particles to be used so that an oxide film is formed on the surfaces of the soft magnetic particles so as to make the soft magnetic particles nonconductive. However, the surface resistance value of the electromagnetic wave suppressor sheet obtained in the related art is $10^7$–$10^8$ $\Omega$. Though there is an effect in reducing unnecessary radiation, it has to be said that this technique is not satisfactory as a measure against short-circuit or crosstalk when the electromagnetic wave suppressor sheet is installed on lead pins of a semiconductor package.

From such a point of view, the magnetic particles filled into an electromagnetic wave suppressor sheet at a high ratio are required to have not only a large imaginary part permeability $\mu''$ but also electric insulation properties.

SUMMARY OF THE INVENTION

The invention was developed in such circumferences. An object of the invention is to provide an electromagnetic wave suppressor sheet which can reduce unnecessary radiation of electromagnetic waves from electronic equipment at a high level and which has not only a large imaginary part permeability $\mu''$ but also excellent electric insulation properties.

In order to attain the foregoing object, an electromagnetic wave suppressor sheet according to the invention is designed to be formed into a sheet-like shape out of a material made of synthetic resin or rubber in which powder of conjugated magnetic particles surface-treated with an insulating inorganic material has been dispersed.

That is, in order to obtain an electromagnetic wave suppressor sheet using magnetic loss of magnetic particles and excellent in unnecessary radiation reduction properties as a measure against electromagnetic interference, the inventor et al. conducted a series of investigations chiefly into electric insulation properties of magnetic particles used as filler of the electromagnetic wave suppressor sheet. As a result, the inventor et al. found that when conjugated magnetic particles surface-treated with an insulating inorganic material were used, an electromagnetic wave suppressor sheet having sufficiently high volume resistivity and extremely improved electric insulation properties could be obtained. Thus, the inventor et al. achieved the invention.

Features and advantages of the invention will be evident from the following detailed description of the preferred embodiments described in conjunction with the attached drawings.

DETAILED DESCRIPTION OF THE PREFERRED EMBODIMENTS

Figure 1:
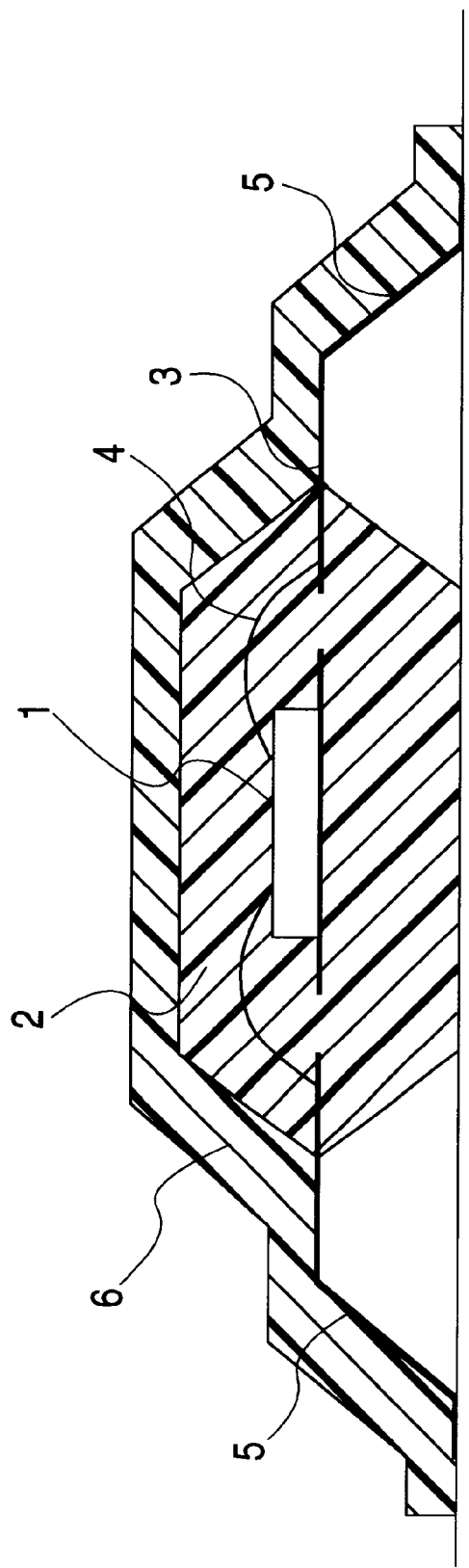
FIG. 1.—A sectional view showing an electromagnetic wave suppressor sheet installed over the surface of a semiconductor device.

Next, description will be made in detail on an embodiment of the invention.

An electromagnetic wave suppressor sheet according to the invention is formed into a sheet-like shape out of a material made of synthetic resin or rubber in which special conjugated magnetic particles have been mixed and dispersed.

The synthetic resin or rubber forming the sheet is not limited specifically. Any synthetic resin or rubber known heretofore may be used if it can be formed into a sheet-like shape. Examples of the synthetic resin or rubber include thermoplastic resin such as polyolefin-based resin such as polyethylene resin or chlorinated polyethylene resin, polyester resin, polyvinyl chloride resin, silicone resin, poly (meth)acrylate resin, polyurethane resin, polyamide resin, natural rubber, isoprene rubber, butadiene rubber, acrylonitrile-butadiene rubber, carboxylated nitrile rubber, ethylene-acrylic rubber, ethylene-propylene rubber, ethylene-propylene-diene rubber, ethylene-vinyl acetate rubber, polyether-urethane rubber, acrylonitrile-butadiene-styrene resin, styrene-butadiene rubber, acrylic rubber, fluororubber, or phosphazene-based fluororubber such as fluorosilicone rubber, vinylidene fluoride rubber, tetrafluoroethylene-propylene rubber or tetrafluoroethylene-perfluoromethyl vinyl ether rubber; thermosetting resin such as epoxy resin, phenolic resin, thermosetting polyurethane resin, thermosetting unsaturated polyester resin, or melamine resin; and heat-resistant resin such as polyimide resin or aromatic polyamide resin.

The special conjugated magnetic particles are magnetic particles having surfaces subjected to coating treatment with an insulating inorganic material.

As the magnetic particles to be subjected to the treatment with the insulating inorganic material, there may be used various metal powders, alloy powders, magnetic powders, or the like, of hematite ($Fe_2O_3$), magnetite ($Fe_3O_4$), various ferrites expressed by a general formula $MFe_2O_4$ or $MO.nFe_2O_3$ (in both the formulae, M designates a bivalent metal particle, including Mn, Co, Ni, Cu, Zn, Ba, Mg, etc; on the other hand n designates a positive number; and further, as the bivalent metal particles M, the same kind of particles or different kinds of particles may be repeated), silicon steel powder, Permalloy (Fe—Ni alloy), Co-based amorphous alloy, Sendust (Fe—Al—Si alloy), Alperm (Fe—Al alloy), Supermalloy (Ni—Fe—Mo alloy), Mu-metal (Ni—Fe—Cu—Mo alloy), Permendur (Fe—Co alloy), and Perminvar (Fe—Ni—Co alloy). Each of these powders may be used alone. Alternatively, two or more kinds of the powders may be used together.

It is preferable that magnetic particles having a maximum particle size of not larger than 500 μm and an average particle size in a range of 1–100 μm are used as the magnetic particles. The average particle size is especially preferably in a range of 10–50 μm. The maximum particle size and the average particle size can be, for example, measured with a laser diffraction/scattering type particle size distribution measuring apparatus.

As for the shape of the magnetic particles to be subjected to the treatment in the invention, it is preferable that the magnetic particles have at least one shape selected from a group of a flaky shape, a flat shape, a dendritic shape, an angular shape, a granular shape, an acicular shape, an irregular shape, a spongy shape and a spherical shape. Especially it is preferable that the magnetic particles have a shape such as a flaky shape or a flat shape with a large aspect ratio. That is, the magnetic field anisotropy increases as the magnetic particles are flatter with a larger aspect ratio. As a result, the magnetic loss can be increased in an electromagnetic wave suppressor sheet in which the surface-treated conjugated magnetic particles have been mixed and dispersed. Thus, the effect of reduction in unnecessary radiation increases.

The insulating inorganic material used in the surface treatment for the magnetic particles is not limited specifically. Any material can be used if it has electric insulation properties. For example, silica fine powder or alumina fine powder may be used. Especially, the silica fine powder is used preferably. Of the silica fine powder, spherical silica fine powder, triturated silica fine powder, granular type silica fine powder, and the like, are preferable. In addition, from the point of view of fine particle size, the silica fine powder having an average primary particle size of 1–1,000 nm is preferably used. Especially the silica fine powder having an average primary particle size of 10–500 nm is preferably used.

The special conjugated magnetic particles having surfaces subjected to coating treatment with the insulating inorganic material can be, for example, manufactured in the following manner. That is, the magnetic particles and the insulating inorganic material are thrown into a surface treatment apparatus having a rotor rotating at high velocity, a stator and a circulating circuit. A conjugating method known heretofore, such as a treatment method in which the magnetic particles and the insulating inorganic material repeatedly suffer mechanical actions using mechanical impulsive force such as compression, friction, or shearing, is used so that the special conjugated magnetic particles can be manufactured. By such a treatment, the surfaces of the magnetic particles are coated with the insulating inorganic material so that the so-called conjugated magnetic particles having surfaces coated with the insulating inorganic material can be obtained.

In the electromagnetic wave suppressor sheet in which the conjugated magnetic particles obtained thus by use of the magnetic particles having not only a large imaginary part permeability "$\mu$" but also electric insulation properties have been mixed and dispersed, it is preferable that the content of the special conjugated magnetic particles is set to be 30–95 weight % of the total weight of the materials forming the electromagnetic wave suppressor sheet. It is more preferable that the content is 50–90 weight %, and it is especially more preferable that the content is 70–85 weight %. That is, when the content of the special conjugated magnetic particles exceeds 95 weight %, the production of the sheet which will be described later becomes difficult, and defects such as voids are produced easily. On the contrary, when the content is lower than 30 weight %, there is seen a tendency that the effect of the magnetic loss as an electromagnetic wave suppressor sheet becomes insufficient.

Further, the special conjugated magnetic particles may be subjected to surface treatment with various known coupling agents in order to improve the wettability with the synthetic resin or rubber as a main component.

The coupling agents are not limited specifically. Any coupling agent known heretofore may be used if it can treat the insulating inorganic material existing on the surfaces of the magnetic particles. Examples of such coupling agents include silane coupling agents such as γ-glycidoxy propyltrimethoxysilane, and β-(3,4-epoxycyclohexyl) ethyltrimethoxysilane; titanate-based coupling agents; and aluminum chelate coupling agents.

If necessary, additives other than the synthetic resin or rubber and the special conjugated magnetic particles may be appropriately mixed into the materials forming the electromagnetic wave suppressor sheet according to the invention.

Examples of the additives include heat-conductive inorganic fillers, stress reduction agents, coloring agents, coupling agents, fire retardants, mold release agents.

Examples of the heat-conductive inorganic fillers include alumina powder, aluminum nitride powder, silicon nitride powder, boron nitride powder, and Kovar powder.

Examples of the stress reduction agents include silicone compounds such as side-chain ethylene glycol type dimethylsiloxane, and acrylonitrile-butadiene rubber.

Examples of the coloring agents include pigments such as carbon black or titanium oxide, and various kinds of dyestuffs. Incidentally, examples of the mold release agents include polyethylene wax, carnauba wax, and fatty acid salts.

Examples of the coupling agents include coupling agents similar to those described previously, that is, silane coupling agents such as γ-glycidoxy propyltrimethoxysilane, and β-(3,4-epoxycyclohexyl)ethyltrimethoxysilane.

Examples of the fire retardants include brominating fire retardants, phosphorus containing fire retardants, aluminum hydroxide, and magnesium hydroxide.

Further, other than the fire retardants, polyhedral conjugated metal hydroxide expressed by the following formula (1) may be used. This conjugated metal hydroxide has a polyhedral crystal form. The conjugated metal hydroxide does not have a usual hexagonal lamellar shape or a so-called thin tabular crystal shape such as a flaky shape, but has a granular crystal shape such as an approximately dodecahedral shape, an approximately octahedral shape or an approximately tetrahedral shape, in which the crystal growth is great in the thickness direction (c-axis direction) as well as lengthwise and crosswise, for example, a lamellar crystal has grown in the thickness direction (c-axis direction) so as to be cubed and approximated to a sphere.

[Formula 1]

$$M_{1-x}Q_x(OH)_2 \qquad (1)$$

[In the formula (1), M designates at least one kind of metal atom selected from a group of Mg, Ca, Sn and Ti, and Q designates at least one kind of metal atom selected from a group of Mn, Fe, Co, Ni, Cu and Zn. In addition, x designates a positive number of 0.01–0.5.]

The metal hydroxide having a polyhedral crystal shape can be obtained as follows. That is, crystal growth in the thickness direction (c-axis direction) as well as lengthwise and crosswise is increased, for example, by controlling various conditions in the process for producing metal hydroxide. Thus, metal hydroxide having a desired polyhedral shape such as an approximately dodecahedral shape, an approximately octahedral shape or an approximately tetrahedral shape, can be obtained. Generally, the metal hydroxide is made of a mixture of such metal hydroxides.

Specific prototypes of such metal hydroxides having polyhedral shapes can be expressed by the formula $Mg_{1-x}Ni_x(OH)_2$ [0.01<X<0.5], $Mg_{1-x}Zn_x(OH)_2$ [0.01<X<0.5], and the like. One of examples of commercial products of such metal hydroxides is ECHORMAG made by Tateho Chemical Industries Co., Ltd.

In addition, the aspect ratio of the metal hydroxide having a polyhedral shape is normally 1–8, preferably 1–7, and more preferably 1–4. The aspect ratio here means the ratio of the major axis of the metal hydroxide to the minor axis thereof. That is, when the aspect ratio exceeds 8, an epoxy resin composition containing this metal hydroxide is short of effect on the lowering of viscosity when the epoxy resin composition melts.

For example, the electromagnetic wave suppressor sheet according to the invention can be manufactured as follows. That is, predetermined loadings of synthetic resin or rubber and conjugated magnetic particles which are essential components, and predetermined loadings of other additives are compounded and mixed adequately by melt dispersion by use of a heated roll, an extruder, a kneader or the like. Then, the mixture is passed between reduction rolls so as to be formed into a sheet-like shape. Alternatively, the mixture is once cooled, and then compression-molded by a hot press molder or the like so as to be formed into a sheet-like shape. Alternatively, synthetic resin or rubber is dissolved in an organic solvent, and predetermined loadings of conjugated magnetic particles and other additives are added, stirred and mixed adequately by use of a dispersion mixer having large shearing force, such as a homomixer. The solution prepared thus is applied onto a release substrate in a coating method, and then dried so that a sheet is formed. The electromagnetic wave suppressor sheet can be manufactured in such a manner.

The volume resistivity of the electromagnetic wave suppressor sheet obtained thus is preferably not lower than $1\times10^{10}$ Ω·cm, and more preferably $1\times10^{10}$–$1\times10^{17}$ Ω·cm.

Further, the thickness of the electromagnetic wave suppressor sheet is set suitably in accordance with parts, applications, and the like, for which the electromagnetic wave suppressor sheet will be used. The thickness is normally set to be about 0.01–5 mm.

The electromagnetic wave suppressor sheet obtained thus is, for example, installed and used to cover the whole surface of an electronic device such as a semiconductor device. For such applications in which the electromagnetic wave suppressor sheet is installed and used to cover the whole of an electronic device, the electromagnetic wave suppressor sheet is fixed in tight contact with the electronic device by use of a commercially available double-face adhesive tape (for example, No. 500 made by Nitto Denko Corporation).

Next, description will be made on examples together with comparative examples.

EXAMPLE 1

[Preparation of Conjugated Magnetic Particles a]

Mn—Zn-based flat soft ferrite powder having, an average particle size of 12 μm and spherical silica fine powder having a primary particle size of about 12 nm were prepared. Then, the Mn—Zn-based flat soft ferrite powder and the spherical silica fine powder compounded so that the ratio of the latter to the former was 10 parts by weight (hereinafter abbreviated to "parts") to 100 parts were thrown into a surface treatment apparatus having a rotor rotating at a high velocity, a stator and a circulating circuit. The surface treatment apparatus was driven for 3 minutes at the rotation speed of 4,800 rpm. Then, conjugated magnetic particles a in which the Mn—Zn-based flat soft ferrite powder was subjected to insulating coating with the spherical silica fine powder were discharged from this apparatus. Thus, the conjugated magnetic particles a were produced.

[Preparation of Electromagnetic Wave Suppressor Sheet A]

Next, 80 parts of the conjugated magnetic particles a, 20 parts of complex resin between silicone rubber and ethylene-propylene-diene monomer copolymer rubber (EPDM) and with Mooney viscosity 29 (100° C.) before vulcanization, and 0.8 parts of γ-glycidoxy propyltrimethoxysilane were weighed and compounded, kneaded and dispersed by use of two heated rolls while being added with 0.3 parts of dicumyl peroxide, and then passed between reduction rolls. After that, vulcanization was performed at 150° C. for 2 hours. Thus, an aimed electromagnetic wave suppressor sheet A was produced.

EXAMPLE 2

[Preparation of Conjugated Magnetic Particles b]

Ni—Cu—Zn-based granular soft ferrite powder having an average particle size of 23 μm and spherical silica fine powder having a primary particle size of about 100 nm were prepared. Then, the Ni—Cu—Zn-based granular soft ferrite powder and the spherical silica fine powder compounded so that the ratio of the latter to the former was 10 parts to 100 parts were thrown into a surface treatment apparatus having a rotor rotating at a high velocity, and inner pieces. The surface treatment apparatus was driven for 10 minutes at the rotation speed of 2,600 rpm. Then, conjugated magnetic particles b in which the Ni—Cu—Zn-based granular soft ferrite powder was subjected to insulating coating with the spherical silica fine powder were discharged from this apparatus. Thus, the conjugated magnetic particles b were produced.

[Preparation of Electromagnetic Wave Suppressor Sheet B]

The conjugated magnetic particles b was used. The other things were set similarly to those in Example 1. Thus, an aimed electromagnetic wave suppressor sheet B was produced.

EXAMPLE 3
[Electromagnetic Wave Suppressor Sheet C]

The EPDM complex resin used in Example 1 was used by 150 parts. The other things were set similarly to those in Example 1. Thus, an aimed electromagnetic wave suppressor sheet C was produced.

EXAMPLE 4
[Electromagnetic Wave Suppressor Sheet D]

The EPDM complex resin used in Example 1 was used by 10 parts. The other things were set similarly to those in Example 1. Thus, an aimed electromagnetic wave suppressor sheet D was produced.

COMPARATIVE EXAMPLE
[Preparation of Magnetic Particles e]

Mn—Zn-based flat soft ferrite powder having an average particle size of 12 $\mu$m was used as it was.

[Preparation of Electromagnetic Wave Suppressor Sheet E]

Next, 73 parts of the magnetic particles e and 0.73 parts of $\gamma$-glycidoxy propyltrimethoxysilane were used. The other things were set similarly to those in Example 1. Thus, an aimed electromagnetic wave suppressor sheet E was produced.

Upon each electromagnetic wave suppressor sheet obtained thus, imaginary part permeability $\mu''$, volume resistivity and noise radiation level were measured and evaluated according to the following methods. Tables 1 and 2 which will be described later show the results together.

[Imaginary Part Permeability $\mu''$]

By use of each electromagnetic wave suppressor sheet, a cylindrical doughnut-shaped molded product (molded product for testing in a coaxial tube) measuring 7 mm in outer diameter by 3 mm in inner diameter by 2 mm in thickness was produced. Upon the obtained specimen (molded product), complex permeability $\mu''$ at a frequency of 900 MHz was measured with a network analyzer by use of a material constant measuring apparatus.

[Volume Resistivity]

By us of each electromagnetic wave suppressor sheet, a disc-shaped molded product measuring 3 mm in thickness by 50 mm in diameter was produced. Then, silver electrodes were produced by use of silver paste so that the diameter of a main electrode was 30 mm, the diameter of a guard electrode was 32 mm, and the diameter of an opposed electrode was 45 mm. After that, DC voltage of 500 V was applied to the molded product to measure the volume resistivity (based on JIS K 6911).

[Noise Radiation Level With Semiconductor Device]

FIG. 1 is a sectional view showing an electromagnetic wave suppressor sheet installed all over the surface of a semiconductor device. As shown in FIG. 1, by use of a double-face adhesive tape (No. 500 made by Nitto Denko Corporation), each electromagnetic wave suppressor sheet (1 mm thick) 6 was installed in tight contact with the whole surface of an SOP (Small Out-line Package) including lead pins 5. The SOP was a semiconductor device in which a semiconductor element 1 (CMOS measuring 1.23 mm by 1.18 mm, in which the semiconductor element 1 and lead frames 3 were electrically connected through gold wires 4) was sealed off by a sealing resin layer 2 made of epoxy resin based sealer (MP-10 made by Nitto Denko Corporation) containing silica powder. While this resin-sealed semiconductor package was operated at 20 MHz, scanning at a pitch of 5 mm was carried out 6 mm above the package by use of an electromagnetic wave exploring probe so as to measure noise (in a range of 200–300 MHz) radiated from the package.

TABLE 1

|  | Example | |
| --- | --- | --- |
|  | 1 | 2 |
| imaginary part permeability $\mu''$ | 3.0 | 2.8 |
| volume resistivity ($\Omega \cdot$ cm) | $3.1 \times 10^{14}$ | $3.8 \times 10^{15}$ |
| Noise radiation level (dB$\mu$V) | 76 | 76 |

TABLE 2

|  | Example | | Comparative Example |
| --- | --- | --- | --- |
|  | 3 | 4 |  |
| imaginary part permeability $\mu''$ | 0.7 | 3.4 | 3.0 |
| volume resistivity ($\Omega \cdot$ cm) | $5.6 \times 10^{15}$ | $1.5 \times 10^{14}$ | $3.1 \times 10^{6}$ |
| Noise radiation level (dB$\mu$V) | 83 | 74 | 77 |

From the results of Tables 1 and 2, it is proved that the electro magnetic wave suppressing properties of the products in Examples are no less than or on the same level as those in Comparative Example about the values of the imaginary part permeability $\mu''$ and the noise radiation level in the SOP semiconductor package, while the volume resistivity of the products in Examples is so high that the products are superior in electric insulation resistance. From this fact, it is apparent that the products in Examples have an effect of improvement on electric insulation properties.

As described above, an electromagnetic wave suppressor sheet according to the invention is formed out of a material made of synthetic resin or rubber in which powder of conjugated magnetic particles surface-treated with an insulating inorganic material has been dispersed. Accordingly, the electromagnetic wave suppressor sheet is excellent in electric insulation properties. Thus, when the electromagnetic wave suppressor sheet is installed over the leads of a semiconductor package, unnecessary radiation can be reduced efficiently without causing any problem of short-circuit between leads, crosstalk, or the like. On the other hand, when the electromagnetic wave suppressor sheet is installed in electronic equipment, an adhesive layer of a double-face adhesive tape or the like is generally formed on the back side of the electromagnetic wave suppressor sheet so as to attach the electromagnetic wave suppressor sheet to the electronic equipment. In case the sheet might be detached, the sheet is required to be an insulator with high insulation resistance. However, related-art sheets (for example, iron-silicon-based flat magnetic particles/rubber composite sheets) have about a surface resistance of about $10^{6}$ $\Omega$, and do not have sufficient insulation properties. In contrast, the electromagnetic wave suppressor sheet according to the invention have a sufficiently high insulation resistance because conjugated magnetic particles having surfaces coated with the insulating inorganic material are used. In case the electro magnetic wave suppressor sheet is detached, there will occur no failure in the electronic equipment.

Thus, the electromagnetic wave suppressor sheet according to the invention is excellent in the unnecessary radiation reduction characteristic using the magnetic loss of the magnetic particles, and excellent in the electric insulation properties. Therefore, the electromagnetic wave suppressor sheet can cope with the advance of higher frequency.

This invention should not be limited to the embodiments described above. Various modifications can be included in this invention within a range which can be easily realized by those skilled in the art without departing from the spirit of the scope of claim.

What is claimed is:

1. An electromagnetic wave suppressor sheet comprising a sheet of synthetic resin or rubber in which powder of magnetic particles having a surface coated with an insulating inorganic material is dispersed, wherein said insulating inorganic material comprises silica powder having an average primary particle size of 1 nm to 1,000 nm.

2. An electromagnetic wave suppressor sheet according to claim 1, wherein a magnetic particle of said magnetic particle is at least one of $Fe_2O_3$ and $Fe_3O_4$.

3. An electromagnetic wave suppressor sheet according to claim 1, wherein a magnetic particle of said magnetic particle is at least one of $MFe_2O_4$ or $MO.nFe_2O_3$, wherein M designates a bivalent metal particle and n designates a positive number.

4. An electromagnetic wave suppressor sheet according to claim 3, wherein M is at least one of selected from a group consisting of Mn, Co, Ni, Cu, Zn, Ba and Mg.

5. An electromagnetic wave suppressor sheet according to claim 1, wherein a magnetic particle of said magnetic particle is at least one of selected from a group consisting of silicon steel powder, Fe—Ni alloy, amorphous metallic alloy containing Co, Fe—Al—Si alloy, Fe—Al alloy, Ni—Fe—Mo alloy, Ni—Fe—Cu—Mo alloy, Fe—Co alloy, and Fe—Ni—Co alloy.

6. An electromagnetic wave suppressor sheet according to claim 1, wherein said powder of magnetic particles is powder having at least one shape selected from a group consisting of a flaky shape, a flat shape, a dendritic shape, an angular shape, a granular shape, an acicular shape, an irregular shape, a spongy shape and a spherical shape.

7. An electromagnetic wave suppressor sheet according to claim 1, wherein a content of said magnetic particles is in a range of 30–95 weight % of a total weight of said electromagnetic wave suppressor sheet.

8. An electromagnetic wave suppressor sheet according to claim 1, further comprising polyhedral metal hydroxide expressed by the following formula,

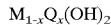

$$M_{1-x}Q_x(OH)_2$$

wherein M designates at least one of selected from a group consisting of Mg, Ca, Sn and Ti, Q designates at least one of selected from a group consisting of Mn, Fe, Co, Ni, Cu and Zn, and x designates a positive number of 0.01–0.5.

9. An electromagnetic wave suppressor sheet according to claim 8, wherein said metal hydroxide is one of $Mg_{1-x}Ni_x(OH)_2$, $0.01<X<0.5$, and $Mg_{1-x}Zn_x(OH)_2$, $0.01 \leq X<0.5$.

10. An electromagnetic wave suppressor sheet according to claim 8, wherein an aspect ratio of said metal hydroxide is in a range of from 1 to 8.

11. An electromagnetic wave suppressor sheet according to claim 1, wherein volume resistivity of said sheet as a whole is not lower than $1 \times 10^{10}$ Ω·cm.

12. An electromagnetic wave suppressor sheet according to claim 1, wherein said silica powder has an average primary particle size of 10 nm to 500 nm.

13. A method for manufacturing an electromagnetic wave suppressor sheet, the method comprising:

subjecting magnetic particles and insulating inorganic particles to repetitive mechanical actions using mechanical impulsive force including at least one of compression, friction, and shearing, so that the magnetic particles are surface coated with the insulating inorganic particles;

dispersing the magnetic particles surface-coated with the insulating inorganic particles in a synthetic resin or rubber; and forming the synthetic resin or rubber with the dispersed magnetic particles surface-coated with the insulating inorganic particles into a sheet.

14. A method for manufacturing an electromagnetic wave suppressor sheet according to claim 13, wherein the magnetic particles and the insulating inorganic particles are subjected to the repetitive mechanical actions using a surface treatment apparatus having a rotor rotating at high velocity, a stator and a circulating circuit.

15. A method for manufacturing an electromagnetic wave suppressor sheet according to claim 13, wherein the insulating inorganic particles comprise silica powder having an average primary particle size of 1 nm to 1,000 nm.

16. A method for manufacturing an electromagnetic wave suppressor sheet according to claim 15, wherein said silica powder has an average primary particle size of 10 nm to 500 nm.

17. A method for manufacturing an electromagnetic wave suppressor sheet according to claim 13, wherein the magnetic particles surface-coated with the insulating inorganic particles are dispersed in the synthetic resin or rubber via melt dispersion by use of a heated roll, an extruder, or a kneader, and the synthetic resin or rubber with the dispersed magnetic particles surface-coated with the insulating inorganic particles is passed between reduction rolls or compression-molded by a hot press molder to form into the sheet.

18. A method for manufacturing an electromagnetic wave suppressor sheet according to claim 13, wherein the magnetic particles surface-coated with the insulating inorganic particles are dispersed in the synthetic resin or rubber by dissolving synthetic resin or rubber in an organic solvent, and mixing the magnetic particles surface-coated with the insulating inorganic particles by use of a dispersion mixer having large shearing force, and the synthetic resin or rubber with the dispersed magnetic particles surface-coated with the insulating inorganic particles is applied onto a release substrate in a coating method and dried to form into the sheet.

19. A method for manufacturing an electromagnetic wave suppressor sheet according to claim 13, wherein a magnetic particle of said magnetic particle is at least one of $Fe_2O_3$ and $Fe_3O_4$.

20. A method for manufacturing an electromagnetic wave suppressor sheet according to claim 13, wherein a magnetic particle of said magnetic particle is at least one of $MFe_2O_4$ or $MO.nFe_2O_3$, wherein M designates a bivalent metal particle and n designates a positive number.

21. A method for manufacturing an electromagnetic wave suppressor sheet according to claim 13, wherein M is at least one of selected from a group consisting of Mn, Co, Ni, Cu, Zn, Ba and Mg.

22. A method for manufacturing an electromagnetic wave suppressor sheet according to claim 13, wherein a magnetic particle of said magnetic particle is at least one of selected from a group consisting of silicon steel powder, Fe—Ni alloy, amorphous metallic alloy containing Co, Fe—Al—Si alloy, Fe—Al alloy, Ni—Fe—Mo alloy, Ni—Fe—Cu—Mo alloy, Fe—Co alloy, and Fe—Ni—Co alloy.

23. A method for manufacturing an electromagnetic wave suppressor sheet according to claim 13, wherein said powder of magnetic particles is powder having at least one shape selected from a group consisting of a flaky shape, a flat shape, a dendritic shape, an angular shape, a granular shape, an acicular shape, an irregular shape, a spongy shape and a spherical shape.

24. A method for manufacturing an electromagnetic wave suppressor sheet according to claim 13, wherein a content of said magnetic particles is in a range of 30–95 weight % of a total weight of said electromagnetic wave suppressor sheet.

25. A method for manufacturing an electromagnetic wave suppressor sheet according to claim 13, wherein polyhedral metal hydroxide is dispersed with the magnetic particles surface-coated with the insulating inorganic particles in the synthetic resin or rubber, the polyhedral metal hydroxide being expressed by the following formula, $$M_{1-x}Q_x(OH)_2$$

wherein M designates at least one of selected from a group consisting of Mg, Ca, Sn and Ti, Q designates at least one of selected from a group consisting of Mn, Fe, Co, Ni, Cu and Zn, and x designates a positive number of 0.01–0.5.

26. A method for manufacturing an electromagnetic wave suppressor sheet according to claim 25, wherein said metal hydroxide is one of $Mg_{1-x}Ni_x(OH)_2$, $0.01<X<0.5$, and $Mg_{1-x}Zn_x(OH)_2$, $0.01<X<0.5$.

27. A method for manufacturing an electromagnetic wave suppressor sheet according to claim 25, wherein an aspect ratio of said metal hydroxide is in a range of from 1 to 8.

28. A method for manufacturing an electromagnetic wave suppressor sheet according to claim 13, wherein volume resistivity of said sheet as a whole is not lower than $1\times10^{10}$ $\Omega\cdot cm$.

* * * * *